(12) United States Patent
Fenk et al.

(10) Patent No.: US 6,521,978 B2
(45) Date of Patent: Feb. 18, 2003

(54) SHIELDING DEVICE AND ELECTRICAL STRUCTURAL PART HAVING A SHIELDING DEVICE

(75) Inventors: Josef Fenk, Eching (DE); Franz Petter, Schwabhausen (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/768,392

(22) Filed: Jan. 24, 2001

(65) Prior Publication Data

US 2001/0026020 A1 Oct. 4, 2001

(30) Foreign Application Priority Data

Jan. 24, 2000 (DE) .......................... 100 02 852

(51) Int. Cl.⁷ .................... H01L 23/552; H01L 29/40
(52) U.S. Cl. ................ 257/659; 257/778; 257/723; 257/783
(58) Field of Search ................. 257/659, 778, 257/723, 783; 438/613, 107, 109, 110, 118

(56) References Cited

U.S. PATENT DOCUMENTS 5,355,016 A * 10/1994 Swirbel et al. ............. 257/659
6,297,551 B1 * 10/2001 Dudderar et al. .......... 257/723

FOREIGN PATENT DOCUMENTS

| JP | 6-120286 | * | 4/1994 | ................. 361/818 |
| JP | 6-268100 | * | 9/1994 | ........... H01L/23/28 |

* cited by examiner

*Primary Examiner*—Jasmine J B Clark
(74) *Attorney, Agent, or Firm*—Laurence A. Greenberg; Werner H. Stemer; Gregory L. Mayback

(57) ABSTRACT

The shielding device described is distinguished by the fact that it has a coating that at least partially surrounds the element that is to be electromagnetically shielded. As a result, the elements that are to be electromagnetically shielded can be optimally shielded with minimal outlay.

30 Claims, 4 Drawing Sheets

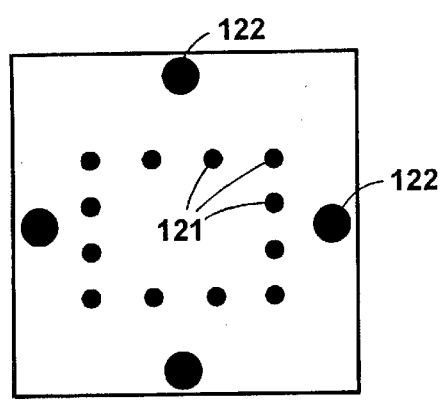
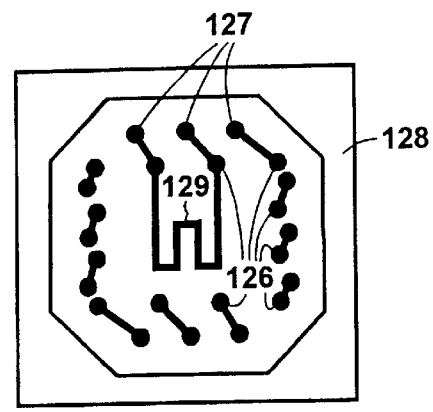
FIG 3
FIG 4
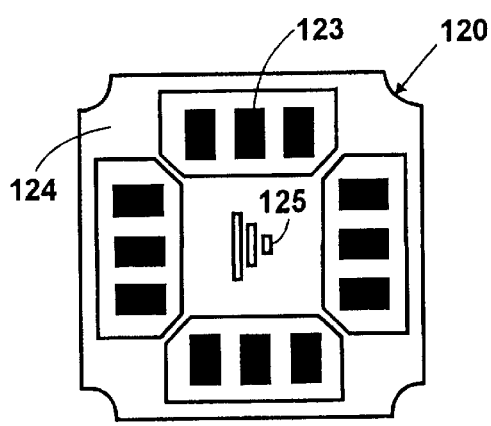
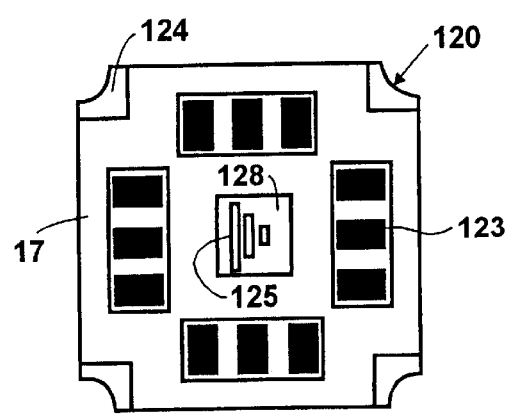
FIG 5
FIG 6

SHIELDING DEVICE AND ELECTRICAL STRUCTURAL PART HAVING A SHIELDING DEVICE

BACKGROUND OF THE INVENTION

Field of the Invention

The present invention relates to a shielding device for the electromagnetic shielding of a semiconductor chip, and an electrical structural part having one or more semiconductor chips and other components of the system containing the electrical structural part.

Semiconductor chips, more precisely the integrated circuits accommodated therein, generate electromagnetic fields in the same way that other electrical circuits do. These electromagnetic fields can interfere with other components of the system containing the semiconductor chips. Conversely, electromagnetic fields generated by other components of the system containing the semiconductor chips can interfere with semiconductor chips.

It is necessary, therefore, at least in specific areas of application, to shield electromagnetically semiconductor chips.

This can be realized for example by placing a shielding cage over the semiconductor chip to be shielded.

However, the practical realization of shielding devices of this type is associated with a considerable outlay.

Corresponding problems arise in electrical structural parts that contain one or more semiconductor chips and/or other components of the system containing the electrical structural part.

SUMMARY OF THE INVENTION

It is accordingly an object of the invention to provide a shielding device and electrical structural part having a shielding device that overcomes the hereinafore-mentioned disadvantages of the heretofore-known devices of this general type and that are to be electromagnetically optimally with minimal outlay.

With the foregoing and other objects in view, there is provided, in accordance with the invention, a shielding device for the electromagnetic shielding of a semiconductor chip, includes a coating at least partially surrounding a semiconductor chip.

In accordance with another feature of the invention, the coating is applied directly on the semiconductor chip.

In accordance with another feature of the invention, the chip is surrounded by a covering. This coating is applied directly to the covering.

In accordance with another feature of the invention, the chip is covered by a covering. This coating is applied directly to the covering.

In accordance with another feature of the invention, the chip is surrounded by a covering. This coating is applied directly to the covering and the semiconductor chip.

In accordance with another feature of the invention, the chip is covered by a compound. This coating is applied directly to the compound and the semiconductor chip.

In accordance with another feature of the invention, the semiconductor chip is mounted on an apparatus. This coating also covers at least parts of the apparatus.

In accordance with another feature of the invention, the shielding device includes a contact point, to which a predetermined potential can be applied. The contact point contacts the coating.

In accordance with another feature of the invention, the semiconductor chip is mounted on the apparatus using flip-chip technology.

In accordance with another feature of the invention, the apparatus is an electrical printed circuit board.

In accordance with another feature of the invention, the electrical printed circuit board has conductor track planes and includes contact points and conductor tracks of the respective conductor track planes. And, the shielding device includes metal areas in the relevant conductor track planes at least partially surrounding the contact points and the conductor tracks.

In accordance with another feature of the invention, the metal areas are electrically connected to the coating.

In accordance with another feature of the invention, the semiconductor chip and the apparatus define a free space therebetween. And, a compound fills the free space.

In accordance with another feature of the invention, the semiconductor has an area to which the coating is applied. The shielding device includes a compound covering and surrounding the semiconductor chip so that the area is free of high and steep steps, pointed corners, and sharp edges.

With the objects of the invention in view, there is also provided an electrical structural part includes a semiconductor chip, and an electrically conductive coating at least partially surrounding the semiconductor chip.

In accordance with another feature of the invention, the electrical structural part includes other components being at least partially surrounded by the electrically conductive coating.

In accordance with another feature of the invention, the coating electromagnetically shields the semiconductor chip.

In accordance with another feature of the invention, the semiconductor chip has a first side and a second side opposing the first side. The first side attached to a circuit. The second side contacts the coating. The coating applies a predetermined potential to the second side.

In accordance with another feature of the invention, the coating is in large-area contact with the second side.

In accordance with another feature of the invention, the coating connects, in a low-impedance manner, to the second side to a point having the predetermined potential.

In accordance with another feature of the invention, the electrical structural part includes an intermediate carrier on which the semiconductor chip is mounted.

In accordance with another feature of the invention, the intermediate carrier is mounted on an electrical printed circuit board.

In accordance with another feature of the invention, the intermediate carrier is formed by a multilayer substrate.

In accordance with another feature of the invention, the coating is applied directly to the semiconductor chip.

In accordance with another feature of the invention, the coating also at least partially covers the intermediate carrier.

In accordance with another feature of the invention, the electrical structural part includes a contact having a predetermined potential contacting the coating.

In accordance with another feature of the invention, the predetermined potential is ground potential.

In accordance with another feature of the invention, the semiconductor chip is mounted on the intermediate carrier using flip-chip technology.

In accordance with another feature of the invention, the is electrical printed circuit board has conductor track planes.

The conductor track planes have contact points and conductor tracks. The conductor points and conductor tracks form the intermediate carrier. The semiconductor chip includes metal areas provided in the conductor track planes surrounding the contact points and conductor tracks.

In accordance with another feature of the invention, the metal areas are electrically connected to the coating.

In accordance with another feature of the invention, the electrical structural includes conductor track structures, and coils formed by the conductor track profiles that are to be provided in a structural part.

In accordance with another feature of the invention, the electrical structural part includes electrically conductive structures for trimming the coils provided above the conductor track structures forming the coils.

In accordance with another feature of the invention, the electrical structural part includes electrically conductive structures for trimming the coils provided below the conductor track structures forming the coils.

In accordance with another feature of the invention, the electrical structural includes a compound filling free spaces between the semiconductor chip and the intermediate carrier.

In accordance with another feature of the invention, the semiconductor chip has areas to be shield by the coating. The electrical structural part includes a compound between the coating and the semiconductor chip. The compound frees the area of high and steep steps, pointed corners, and sharp edges.

In accordance with another feature of the invention, the intermediate carrier includes a depression. The semiconductor chip is at least partially disposed in the depression.

In accordance with another feature of the invention, the intermediate carrier includes a layer having a high dielectric constant.

In accordance with another feature of the invention, the layer can form partially a capacitor.

In accordance with another feature of the invention, the semiconductor chip includes a contact element. The capacitor is a blocking capacitor connecting to a contact element of the semiconductor chip and to a predetermined potential.

Accordingly, it is provided that the shielding device comprises a coating which at least partially surrounds the semiconductor chip; and that the at least one semiconductor chip and/or the other components are at least partially surrounded by an electrically conductive coating.

The electromagnetic shielding of semiconductor chips or electrical structural parts which contain one or more semiconductor chips and/or other components of the system containing the structural part, using an electrically conductive coating, is configured in an extremely simple manner. Such a shielding device can be produced without difficulty with comparatively low outlay, forms a connected unit with the element that is to be electromagnetically shielded, and thus - unlike shielding cages for example - cannot pose problems with handling and mounting, requires no, or at any rate no appreciable, additional space, and exhibits an optimal shielding effect.

In addition or as an alternative, the coating can be used to make contact with, and apply a predetermined potential (preferably ground potential) to, that side of the semiconductor chip that opposes the side of the semiconductor chip on which the electrical circuit accommodated in the semiconductor chip is formed. As a result, mutual influencing (coupling) between different semiconductor chip regions can either be entirely avoided or be at least considerably reduced. By avoiding mutual influencing, the semiconductor chip becomes less susceptible to interfering influences and, as a result, can be operated as intended under all circumstances.

Other features that are considered as characteristic for the invention are set forth in the appended claims.

Although the invention is illustrated and described herein as embodied in a shielding device and electrical structural part having a shielding device, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS:

FIG. 3 shows a plan view of a top conductor track plane provided on the top side of an intermediate carrier of the structural part in accordance with FIG. 1;

FIG. 4 shows a plan view of a middle conductor track plane provided in the intermediate carrier of the structural part in accordance with FIG. 1;

FIG. 5 shows a plan view of a bottom conductor track plane provided on the underside of the intermediate carrier of the structural part in accordance with FIG. 1;

FIG. 6 shows a plan view of the conductor track plane in accordance with FIG. 4 after it has been coated with a protective layer (insulating layer)

DESCRIPTION OF THE PREFERRED EMBODIMENTS

Figure 1:
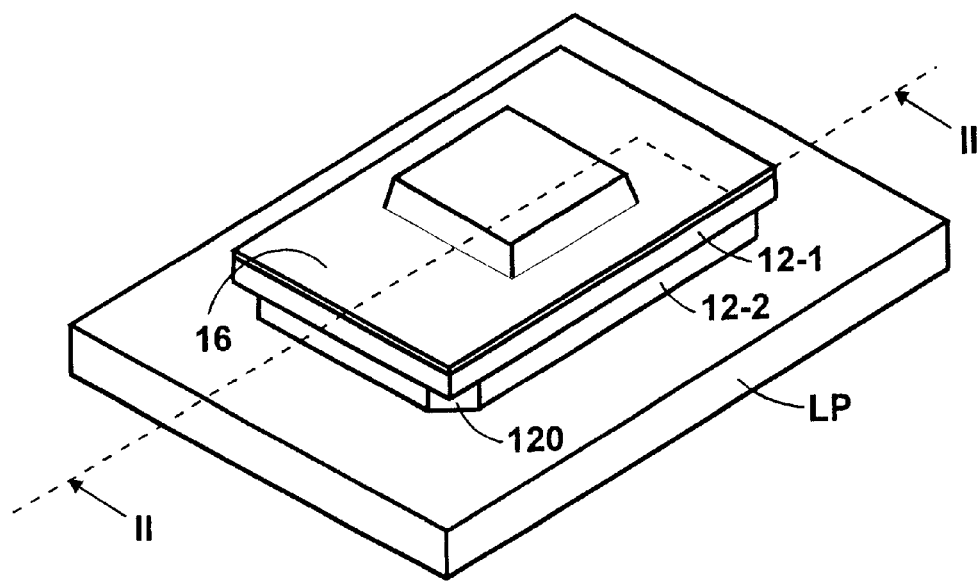
FIG. 1 shows a perspective view of an electrical structural part containing a semiconductor chip.

In all the figures of the drawing, sub-features and integral parts that correspond to one another bear the same reference symbol in each case.

With regard to FIGS. 2 and 7 to 10, the hatchings have been omitted for better clarity.

The electromagnetic shielding of semiconductor chips or electrical structural parts that contain one or more semiconductor chips or other components of the system containing the structural part is explained below using a number of different exemplary embodiments.

The different exemplary embodiments have in common is that the electromagnetic shielding of the elements that are to be electromagnetically shielded is effected using an electrically conductive coating. The electrically conductive coating is preferably (but not necessarily) applied directly to the elements to be shielded, and/or to a (covering and/or filling)

compound covering and/or surrounding the elements to be shielded. The electrically conductive coating preferably (but likewise not necessarily) has a potential (for example ground potential) that is suitable for electromagnetic shielding applied to it.

Referring now to the figures of the drawings in detail and first, particularly to FIGS. 1–6 thereof, there is shown the first exemplary embodiment. This first embodiment relates to the electromagnetic shielding of a semiconductor chip or a structural part containing a semiconductor chip.

The semiconductor chip that is electromagnetically shielded by the shielding device described in more detail below is an arbitrary semiconductor chip. An arbitrary integrated circuit of analog or digital operation is accommodated in the semiconductor chip.

In the example considered, the semiconductor chip to be shielded is a constituent part of a structural part that can be mounted onto a printed circuit board, for example, by soldering, adhesive bonding, mating, or in some other way.

As will be subsequently understood even better, the semiconductor chip to be shielded need not be a constituent of such a structural part. The semiconductor chip to be shielded can be shielded in the manner described below even when the semiconductor chip is mounted directly onto the electrical printed circuit board or onto arbitrary other apparatuses (for example onto a smart card body or onto a module provided for insertion into a smart card body).

Figure 2:
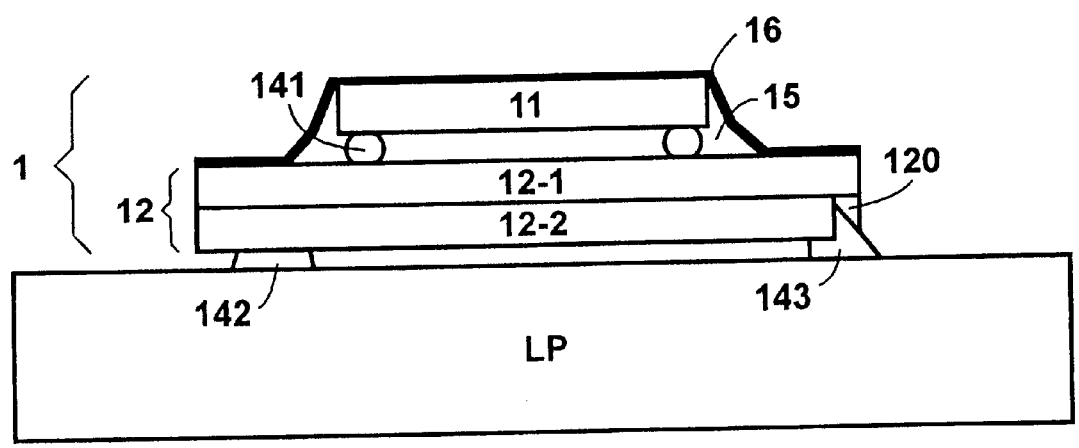
FIG. 2 shows a sectional view through the structural part in accordance with FIG. 1 along a line II—II depicted there.

The semiconductor chip to be shielded is designated by the reference symbol 11 in FIG. 2, and the structural part containing the semiconductor chip 11 is designated by the reference symbol 1. In addition to the semiconductor chip 11, the structural part 1 also contains an intermediate carrier 12.

FIGS. 1–2 show the intermediate carrier 12. The intermediate carrier 12 is a wiring carrier preferably produced from ceramic or a printed circuit board material. This intermediate carrier 12 carries the semiconductor chip 11 and is mounted together with the latter onto a printed circuit board LP.

The mounting of the semiconductor chip 11 onto the apparatus that carries the chip (in the example considered: mounting onto the intermediate carrier 12) is effected according to so-called flip-chip technology in the example considered. In this technology, the semiconductor chip 11 is mounted on the intermediate carrier 12 in such a way that its side carrying the integrated circuit faces the intermediate carrier 12. Soldering or possibly adhesive bonding (using an electrically conductive adhesive) connect the semiconductor chip 11 and the intermediate carrier 12. The connecting points (soldering points, adhesive-bonding points) between the semiconductor chip 11 and the intermediate carrier 12 are designated by the reference symbol 141 in the figures.

No restriction to mounting the semiconductor chip 11 onto the intermediate carrier 12 using flip-chip technology exists. The semiconductor chip 11 can be mounted onto the intermediate carrier 12 using so-called wire-bond technology, that is to say, in such a way that its surface carrying the integrated circuit is remote from the intermediate carrier 12.

The mounting of the intermediate carrier 12 (and thus also of the structural part 1) onto the printed circuit board LP is likewise effected by soldering or by adhesive bonding (using an electrically conductive adhesive) in the example considered. The connecting points (soldering points, adhesive-bonding points) between the intermediate carrier 12 (the structural part 1) and the printed circuit board LP are designated by the reference symbols 142 and 143 in the figures.

As shown in FIG. 2, the intermediate carrier 12 is of multilayer construction (insulation and wiring layers) in the example considered. In the present case, the intermediate carrier 12 is composed of a top insulating layer 12-1 and a bottom insulating layer 12-2 and. The intermediate carrier 12 has, on its top side facing the semiconductor chip 11, on its underside facing the printed circuit board LP, and also between the top layer 12-1 and the bottom layer 12-2, conductor track planes with electrically conductive structures.

The top layer 12-1 and the bottom layer 12-2 have different sizes. As can be seen in particular from FIGS. 1, 2, 5, and 6, the bottom layer 12-1 has corner regions 120 set back inwardly relative to the top layer 12-1, and the top layer 1220 1 projects laterally above said bottom layer at these points.

The electrically conductive structures of the conductor track planes of the intermediate carrier are illustrated in FIG. 3 (top conductor track plane on the top side of the intermediate carrier), FIG. 4 (middle conductor track plane between the intermediate-carrier layers 12-1 and 12-2), and FIG. 5 (bottom conductor track plane on the underside of the intermediate carrier).

As can be seen from FIG. 3, the electrically conductive structures of the top conductor track plane provided on the top side of the intermediate carrier include, in the example considered, contact points 121 and 122. Contact points 121 provide for connection to the semiconductor chip 11. Contact points 122 provide for connection to a shielding device, described in even further detail below, for the electromagnetic shielding of the semiconductor chip 11.

The contact elements of the semiconductor chip 11 are to he connected to the intermediate carrier 12. The contact elements of the semiconductor chip 11 are soldered or adhesively bonded onto the contact points 121. The contact points 121 are situated centrally in the example considered.

The contact points 122 are situated in proximity to edges in the example considered. The contact points 122 contact the shielding device. The shielding device electromagnetically shields the semiconductor chip during the production of said shielding device.

As can be seen from FIG. 5, the electrically conductive structures of the bottom conductor track plane are provided on the underside of the intermediate carrier. These electrically conductive structures include, in the example considered, contact points 123 provided for connection to the printed circuit board LP, and metal areas 124 surrounding the contact points 123.

The contact points 123 and parts of the metal areas 124 are soldered or adhesively bonded to assigned contact points of the printed circuit board LP onto which the structural part 1 is to be mounted. In the example considered, those parts of the metal area 124 are situated in the corner regions of the underside of the intermediate carrier.

FIG. 4 shows the electrically conductive structures of the middle conductor track plane situated between the top intermediate-carrier layer 12-1 and the bottom intermediate-carrier layer 12-2. These electrically conductive structures include contact points 126 situated more or less precisely below the contact points 121, contact points 127 connected to the contact points 126 and situated more or less precisely above the contact points 123, and a metal area 128 surrounding the contact points 126 and 127 and running along the outer edge of the middle conductor track plane.

In the example considered, a spiral or meander-shaped conductor track structure 129 forming an inductance is additionally provided between selected contact points 126 and/or 127; the inductance formed by the conductor track structure 129 can be trimmed as desired through cutouts 125 (the number, size, position and/or form thereof) in the underlying region of the metal area 124 (for example by using lasers or grinding).

Some instances include electrical connections between the electrically conductive structures of the top conductor track plane (FIG. 4), the middle conductor track plane (FIG. 5), and bottom conductor track plane (FIG. 6). More precisely, the contact points 121 of the top conductor track plane are connected to the contact points 126 of the middle conductor track plane via so-called plated-through holes (vias). The contact points 127 of the middle conductor track plane are connected to the contact points 123 of the bottom conductor track plane via plated-through holes. And, the contact points 122 of the top conductor track. plane are connected to the metal area 128 of the middle conductor track plane via plated-through holes. The metal area 128 of the middle conductor track plane is connected to the metal area 124 of the bottom conductor track plane via metal areas provided in the region of the set-back corner sections 120 of the bottom intermediate-carrier layer 12-2 on the lateral outer areas thereof.

As a result, the contact points 121 of the top conductor track plane are connected via the contact points 126 and 127 of the middle conductor track plane to the contact points 123 of the bottom conductor track plane. These contact points 121 are provided for connection to the semiconductor chip 11. These contact points 123 are provided for connection to the printed circuit board LP. The contact points 122 of the top conductor track plane are connected to the metal area 128 of the middle conductor track plane, the metal area 124 of the bottom conductor track plane, and the metal area running in the region of the set-back sections 120 laterally on the outer areas of the bottom intermediate-carrier layer. These contact points 122 are provided for connection to the shielding device.

As has already been mentioned, the semiconductor chip 11 is mounted on the top side of the intermediate carrier 12 (on the top conductor track plane). In this case, the connection of the contact elements of the semiconductor chip 11 and of the assigned contact points 121 of the top conductor track plane is effected via the already mentioned connecting points 141 formed by a soldering compound or an electrically conductive adhesive.

The interspace remaining between the semiconductor chip 11 and the intermediate carrier 12 when the semiconductor chip 11 is mounted onto the intermediate carrier 12 is filled by an electrically insulating filling compound. The so-called underfill 15 formed as a result preferably extends laterally beyond the semiconductor chip 11 and surrounds the latter in such a way as to produce, from that side of the semiconductor chip 11 which is remote from the intermediate carrier 12, a homogeneous area which falls only gradually (relatively shallowly) toward the intermediate carrier 12, without any sharp edges and pointed corners. In this case, however, the underfill 15 extends at most as far as the contact points 122 of the top conductor track plane. The underfill 15 does not cover the contact points 122.

Finally, an electrically conductive coating 16 is applied over the semiconductor chip 11, the uncovered regions of the underfill 15, and the uncovered regions of the intermediate carrier 12. This electrically conductive coating 16 is an essential constituent part of the shielding device—already mentioned a number of times above—for the electromagnetic shielding of the semiconductor chip 11.

The coating 16 is applied by sputtering, for example, but can, of course, also be produced in any other desired way.

As stated, the coating 16 covers not only the semiconductor chip 11 to be shielded but also those regions of the intermediate carrier 12 that are not covered by the underfill 15. As a result, the coating 16 comes into contact with the contact points 122 of the top conductor track plane, and, via the latter, also with the metal area 128 of the middle conductor track plane, the metal area 124 of the bottom conductor track plane, and the metal areas provided on the lateral outer areas of the inwardly set-back sections 120 of the bottom intermediate-carrier layer 12-2.

The metal area 124 of the bottom conductor track plane and/or the metal areas provided on the lateral outer areas of the inwardly set-back sections 120 of the bottom intermediate-carrier layer 12-2 are electrically connected to the printed circuit board LP when the intermediate carrier 12 (the structural part 1) is mounted onto said printed circuit board. In the example considered, the connecting points 143, already mentioned above, accomplish this. The connecting points 142, likewise already mentioned, serve for connecting the contact points 123 of the bottom conductor track plane to assigned contact points of the printed circuit board LP.

The coating 16 can thus be connected via the printed circuit board LP to ground or have applied to it some other potential that is suitable for electromagnetic shielding.

The coating 16 that surrounds the semiconductor chip 11 at the top and laterally can thus effect excellent electromagnetic shielding of the semiconductor chip. For this reason, and because the metal areas 128 of the middle conductor track plane and 124 of the bottom conductor track plane which are connected to the coating 16 also perform a shielding function for the semiconductor chip 11 and the electrical lines between the latter and the printed circuit board LP, the semiconductor chip 11 is optimally electromagnetically shielded in an extremely simple manner.

In order to protect the bottom conductor track plane, the latter, more precisely those points thereof that are not to be connected to the printed circuit board LP, can be covered with a protective layer or insulating layer having dielectric properties. This is illustrated in FIG. 6; the protective layer is designated by the reference symbol 17 in this case.

It should be clear that a structural part 1 constructed in the manner described can also comprise a plurality of semiconductor chips 11 and/or other components of the system containing the structural part 1.

Figure 7:
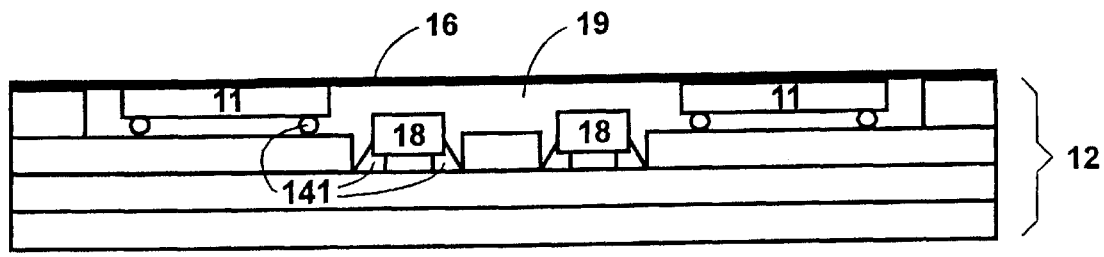
FIGS. 7 to 10 show sectional views of various other electrical structural parts having one or more semiconductor chips and/or other components of the system containing the structural part.

An example of such a structural part is illustrated in FIG. 7.

The structural part illustrated in FIG. 7 contains two semiconductor chips 11 and also two further components 18. The further components 18 may be resistors, capacitors, coils, or any other electrical or electromechanical components.

Furthermore, the structural part shown in FIG. 7 differs from the structural part shown in FIGS. 1 to 6 in that the intermediate carrier 12 has more than two, more precisely four, layers lying one above the other, and correspondingly more conductor track planes. In addition, the semiconductor chips 11 and the further components 18 are inserted into depressions provided in the intermediate carrier 12. Furthermore, after the insertion of the semiconductor chips 11 and the further components 18 and the introduction of the underfill 15, the depressions are potted with a covering compound 19 which laterally surrounds the semiconductor chips 11 and laterally surrounds and (at least if there is a short-circuit risk also) covers the further components 18, with the result that the area to be provided with the coating 16 is formed as a planar area.

Figure 8:
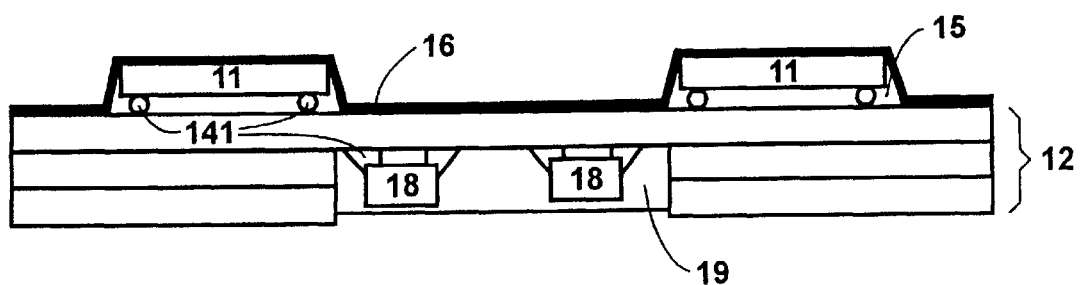

Another embodiment of a structural part containing two semiconductor chips 11 and two further components 18 is illustrated in FIG. 8.

The structural part shown in FIG. 8 differs from the structural part shown in FIGS. 1 to 6 not only in the type and number of the components provided therein but also in that the intermediate carrier 12 has more than two, more precisely three, layers lying one above the other, and correspondingly more conductor track planes, and the further components 18 (to be precise only the latter) are inserted into depressions provided in the intermediate carrier 12. The depressions are situated on that side of the intermediate carrier 12 that is opposite to that side of the intermediate carrier 12 that carries the semiconductor chips 11, and the further components 18 not being electromagnetically shielded.

Figure 9:
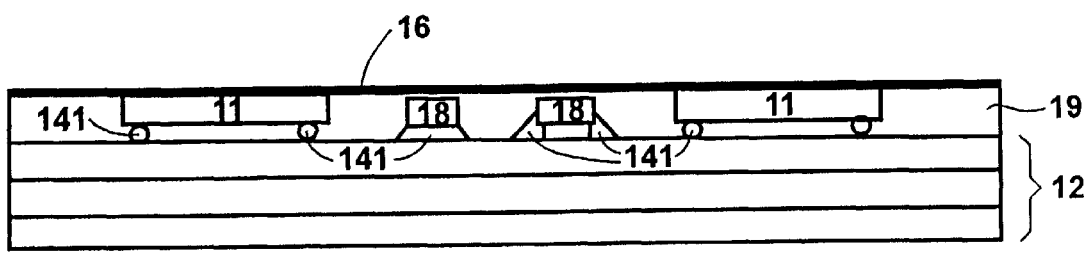

A further embodiment of a structural part containing two semiconductor chips 11 and two further components 18 is illustrated in FIG. 9.

The structural part shown in FIG. 9 differs from the structural part shown in FIGS. 1 to 6 not only in the type and number of the components provided therein but also in that the intermediate carrier 12 has more than two, more precisely three, layers lying one above the other, and correspondingly more conductor track planes. In addition, both the semiconductor chips 11 and the other components 18 are mounted onto the top side (not having any depressions) of the intermediate carrier 12. The semiconductor chips 11 and the further components 18, after their mounting onto the intermediate carrier 12 and the introduction of the underfill 15, are encapsulated by potting with a covering compound 19 that laterally surrounds the semiconductor chips 11 and laterally surrounds and (at least if there is a short-circuit risk also) covers the further components 18. The result is that the area to be provided with the coating 16 is formed as a planar area. The coating 16 does not come into contact with the intermediate carrier 12, and the coating 16 is connected to ground via a pin or jumper (not shown in FIG. 9), connected to ground.

It should be clear that, as described, electromagnetically shielded structural parts can contain arbitrarily many semiconductor chips and other components, and that the semiconductor chips and other components can also be integrated into the structural part in any other different manner from that in the examples explained above. Care must be taken "only" to ensure that the region which is to be provided with the electromagnetically shielding coating 16 is suitable for being coated with the coating 16, that is to say, in particular, has no high and/or steep steps, sharp edges and/or pointed corners.

Even more efficient shielding can be achieved if capacitors are integrated in the structural part, via which capacitors the contact elements of the semiconductor chips 11 or of the other components 18 or the line paths connected thereto are at least partly (i.e. individual, a plurality or all of the contact elements or line paths connected thereto) connected to ground. Such capacitors can be realized as follows:

one of the intermediate-carrier layers is formed from a material having a high dielectric constant, or an additional intermediate-carrier layer made of a material having a high dielectric constant is provided; and electrically conductive structures are provided on one side of this intermediate-carrier layer, which structures are connected to the contact elements which are to be connected to ground via capacitors, and areas or structures connected to ground are provided on the other side of this intermediate-carrier layer in a position opposite to the electrically conductive structures formed on the first side.

Figure 10:
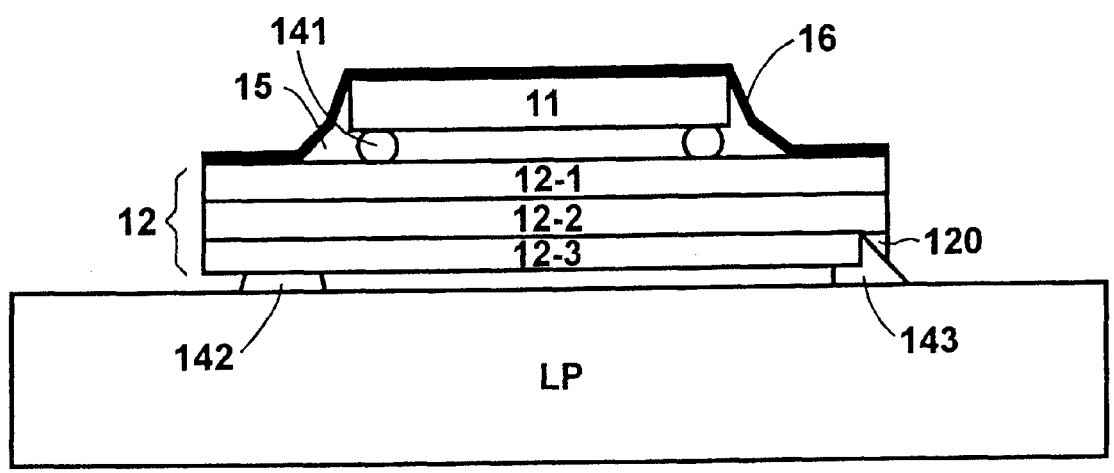

A structural part constructed in such a way is illustrated in FIG. 10.

The structural part as shown in FIG. 10 largely corresponds to the structural part as shown in FIGS. 1–6. However, it, more precisely the intermediate carrier 12 thereof, has an additional layer 12-3 fabricated from material having a high dielectric constant.

On its side facing the printed circuit board LP, the additional intermediate-carrier layer 12-3 has a conductor track plane that is formed and coated like the conductor track plane shown in FIGS. 5 and 6. The conductor track plane provided between the second intermediate-carrier layer 12-2 and the additional third intermediate-carrier layer 12-3 includes structures connected to the contact points 121 and 123, respectively. However, these structures have considerably larger dimensions than the contact points 121 and 123, respectively, to which they are connected. They are so large that they extend into regions in which they are opposite the metal areas 124 of the bottommost conductor track plane, said metal areas being connected to ground. As a result, the additional intermediate-carrier layer 12-3 can be used for realizing capacitors via which individual, a plurality or all of the contact elements of the semiconductor chips contained in the structural part or of other components are connected to ground. As a result, it is possible to dispense with external blocking capacitors and eliminate the associated disadvantages (additional discrete structural parts; high series inductance).

It should be clear that the structural parts described above can be modified in diverse ways, without the structural parts losing the particular properties that distinguish them from conventional structural parts. In particular, it is not absolutely necessary for the coating 16 to have a specific potential applied to it (the connection to ground) via the set-back corner regions 120 of the bottom intermediate-carrier 12-2. Although soldering the corner regions 120 to the printed circuit board LP has the positive effect that the relevant structural part and the connections thereof to the printed circuit board are thereby protected particularly well against the adverse influences which result from different expansions of structural part and printed circuit board under changing temperatures (thermal mismatch), the intermediate carrier can nonetheless also be formed without set-back corner regions 120, and/or the connection between the middle conductor track plane and the bottom conductor track plane of the intermediate carrier can be established via additional plated-through holes.

Structural parts constructed in the manner described or in a similar manner and their shielding device for electromagnetic shielding enable semiconductor chips that are to be electromagnetically shielded and/or other components to be optimally electromagnetically shielded with minimal outlay.

However, the structural parts described are not only distinguished by their simple and outstandingly acting electromagnetic shielding. In the example considered, the coating 16 also serves to make contact with, and apply a predetermined potential, which in general is preferably the ground potential, to, the rear side of the semiconductor chip 11 which is opposite to the side of the semiconductor chip on which the electrical circuit accommodated in the semiconductor chip is formed, that is to say, in the example considered, the side which is remote from the intermediate carrier 12 and is in each case at the top in accordance with the illustration in the figures. In the example considered, this is done by the coating 16 being connected in a large-area manner to the rear side of the semiconductor chip 11 and connecting this side in a low-impedance manner to the contact points 122 of the intermediate carrier 12. The large-area (preferably whole-area) connection of the rear side of the semiconductor chip to a reference-ground potential has the positive effect of reducing the risk of mutual influencing (coupling) of different semiconductor chip regions to a minimum. Semiconductor chips whose rear side has a reference-ground potential applied to it in a large-area and low-impedance manner are less susceptible to interference and, as a result, can always be operated as intended even under difficult conditions.

In the example considered, the coating 16 serves both for the electromagnetic shielding of the semiconductor chip and for the grounding of the rear side of the semiconductor chip. For the sake of completeness, it shall be pointed out that the coating 16 can also be formed and arranged in such a way that it serves "only" for electromagnetic shielding or "only" for the grounding of the rear side of the semiconductor chip.

We claim:

1. An improved shielding device electromagnetically shielding a semiconductor chip, the improvement which comprises:
   a coating at least partially surrounding the semiconductor chip and applied directly on the semiconductor chip.

2. An improved shielding device electromagnetically shielding a semiconductor chip, the improvement which comprises:
   a coating surrounding the semiconductor chip, said coating being applied directly to said semiconductor chip.

3. An improved shielding device electromagnetically shielding a semiconductor chip, the electrical printed circuit board having conductor track planes and including contact points and conductor tracks of the respective conductor track planes, the semiconductor chip being mounted on an electrical printed circuit board; the improvement which comprises:
   a coating at least partially surrounding the semiconductor chip and also covering at least parts of the electrical printed circuit board; and
   metal areas in the relevant conductor track planes at least partially surrounding the contact points and the conductor tracks.

4. The shielding device according to claim 3, wherein said metal areas are electrically connected to the coating.

5. An improved shielding device electromagnetically shielding a semiconductor chip mounted on an apparatus, the improvement which comprises:
   a coating at least partially surrounding the semiconductor chip and covering at least parts of the apparatus, the semiconductor chip and the apparatus defining a free space therebetween; and
   a compound filling the free space.

6. An improved shielding device electromagnetically shielding a semiconductor chip mounted on an apparatus the semiconductor having an area, the improvement which comprises:
   a coating at least partially surrounding the semiconductor chip and covering at least parts of the apparatus and being applied to the area; and
   a compound covering and surrounding the semiconductor chip so that the area is free of high and steep steps, pointed corners, and sharp edges.

7. An electrical structural part comprising:
   a semiconductor chip having a first side and a second side opposing said first side;
   a circuit attached to said first side of said semiconductor chip; and
   an electrically conductive coating at least partially surrounding said semiconductor chip and contacting said second side of said semiconductor chip, said coating applying a predetermined potential to said second side.

8. The electrical structural part according to claim 7, including:
   other components being at least partially surrounded by said electrically conductive coating.

9. The electrical structural part according to claim 7, wherein said coating is in large-area contact with said second side.

10. The electrical structural part according to claim 7, wherein said coating connects, in a low-impedance manner, to said second side to a point having the predetermined potential.

11. The electrical structural part according to claim 7, including:
    an intermediate carrier on which said semiconductor chip is mounted.

12. The electrical structural according to claim 7, wherein said coating electromagnetically shields said semiconductor chip.

13. The electrical structural part according to claim 11, wherein said intermediate carrier is mounted on an electrical printed circuit board.

14. The electrical structural according to claim 11, wherein said intermediate carrier is formed by a multilayer substrate.

15. An electrical structural part, comprising:
    a semiconductor chip; and
    an electrically conductive coating at least partially surrounding said semiconductor chip and applied directly to said semiconductor chip.

16. The electrical structural part according to claim 11, wherein said coating also at least partially covers said intermediate carrier.

17. The electrical structural part according to claim 16, including:
    a contact having a predetermined potential contacting said coating.

18. An electrical structural part, comprising:
    a semiconductor chip;
    an intermediate carrier on which said semiconductor chip is mounted;
    an electrically conductive coating at least partially surrounding said semiconductor chip and at least partially covering said intermediate carrier; and
    a contact having a ground potential contacting said coating.

19. The electrical structural part according to claim 11, wherein said semiconductor chip is mounted on said intermediate carrier using flip-chip technology.

20. An electrical structural part, comprising:
    a semiconductor chip including metal areas;
    an electrical printed circuit board having conductor track planes, the conductor track planes having contact points and conductor tracks; said conductor points and conductor tracks forming an intermediate carrier; said intermediate carrier supporting said semiconductor chip; said metal areas lying in said conductor track planes surrounding said contact points and conductor tracks; and
    an electrically conductive coating at least partially surrounding said semiconductor chip.

21. The electrical structural part according to claim 20, wherein said metal areas are electrically connected to said coating.

22. The electrical structural part according to claim 20, including:

conductor track structures; and coils formed by said conductor track profiles that are to be provided in a structural part.

23. The electrical structural part according to claim 22, including:

electrically conductive structures for trimming said coils provided above said conductor track structures forming said coils.

24. The electrical structural part according to claim 22, including:

electrically conductive structures for trimming said coils provided below said conductor track structures forming said coils.

25. An electrical structural, comprising:

a semiconductor chip; and an electrically conductive coating at least partially surrounding said semiconductor chip;

an intermediate carrier on which said semiconductor chip is mounted; and a compound filling free spaces between said semiconductor chip and said intermediate carrier.

26. An electrical structural part, comprising:

a semiconductor chip having areas to be shielded; and an electrically conductive coating at least partially surrounding said semiconductor chip shielding said areas; and a compound between said coating and said semiconductor chip, said compound freeing said area of high and steep steps, pointed corners, and sharp edges.

27. An electrical structural part, comprising:

a semiconductor chip;

an intermediate carrier supporting said semiconductor chip having a depression formed therein, and said semiconductor chip being at least partially disposed in said depression; and an electrically conductive coating at least partially surrounding said semiconductor chip.

28. An electrical structural part, comprising:

a semiconductor chip;

an intermediate carrier supporting said semiconductor chip;

a layer disposed on said intermediate carrier and having a high dielectric constant; and an electrically conductive coating at least partially surrounding said semiconductor chip.

29. The electrical structural part according to claim 28, wherein said layer. can form partially a capacitor.

30. The electrical structural part according to claim 29, wherein said semiconductor chip includes a contact element, and said capacitor is a blocking capacitor connected to a contact element of said semiconductor chip and to a predetermined potential.

* * * * *